(12) United States Patent
Anand et al.

(10) Patent No.: US 6,768,694 B2
(45) Date of Patent: Jul. 27, 2004

(54) METHOD OF ELECTRICALLY BLOWING FUSES UNDER CONTROL OF AN ON-CHIP TESTER INTERFACE APPARATUS

(75) Inventors: Darren L. Anand, Essex Junction, VT (US); Bruce Cowan, Essex Junction, VT (US); L. Owen Farnsworth, III, Bristol, VT (US); Pamela S. Gillis, Jericho, VT (US); Peter O. Jakobsen, Milton, VT (US); Krishnendu Mondal, Burlington, VT (US); Steven F. Oakland, Colchester, VT (US); Michael R. Ouellette, Westford, VT (US); Donald L. Wheater, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 46 days.

(21) Appl. No.: 10/265,591

(22) Filed: Oct. 7, 2002

(65) Prior Publication Data

US 2004/0066695 A1 Apr. 8, 2004

(51) Int. Cl.⁷ ................................................. G11C 7/00
(52) U.S. Cl. ..................................... 365/225.7; 365/201
(58) Field of Search ............................. 365/225.7, 201, 365/230.06

(56) References Cited

U.S. PATENT DOCUMENTS 5,920,515 A * 7/1999 Shaik et al. ................. 365/200
6,067,262 A * 5/2000 Irrinki et al. ................ 365/201

* cited by examiner

Primary Examiner—Richard Elms
Assistant Examiner—Pho M. Luu
(74) Attorney, Agent, or Firm—McGinn & Gibb, PLLC; Richard M. Kotulak, Esq.

(57) ABSTRACT

A chip repair system designed for automated test equipment independent application on many unique very dense ASIC devices in a high turnover environment is disclosed. During test, the system will control on chip built-in self-test (BIST) engines collect and compress repair data, program fuses and finally decompress and reload the repair data for post fuse testing. In end use application this system decompresses and loads the repair data at power-up or at the request of the system.

44 Claims, 7 Drawing Sheets

METHOD OF ELECTRICALLY BLOWING FUSES UNDER CONTROL OF AN ON-CHIP TESTER INTERFACE APPARATUS

BACKGROUND OF THE INVENTION

1. Field of the Invention

The present invention generally relates to testing and replacing defective devices through the use of fuses and more specifically to an on-chip fuse controller that provides a uniform interface for tester access across multiple chip designs.

2. Description of the Related Art

As technology advances, new process and design techniques extend our possibilities while simultaneously limiting the development and reuse of yesterday's technology. This is the case for fuses. Historically, metal fuses were used for the storage of customization data and repair solutions of defects on silicon chips. Metal fuses required little area relative to devices and could be mechanically programmed with a laser. Today, the area required by metal fuses is significantly greater than the area consumed by the decreasing size of devices. Metal fuses cannot scale with device technology because of the size requirements needed to mechanically program fuses. Metal fuses also require a direct "line-of-sight" for laser access, which complicates the physical design methodology, since fuses may not be placed underneath overlying power busses.

There is an additional factor further complicating this dilemma: as devices decrease in size, it becomes possible to put more devices onto silicon, leading to smaller chips with larger memory arrays that require more fuses to repair defects. The area penalty of metal fuses is now more costly than ever. To further aggravate the problem, mechanical fuse programming requires that all customization and repair data be collected, and stored off-line after each test. Once all data has been collected it is compiled into a single repair solution and translated into XY coordinates corresponding to the fuse locations on the chip.

The customization, test and repair of complex chips in an automated manufacturing test environment with many unique ASIC designs are challenging problems. Initially, metal fuses were located in the individual macros requiring identification or repair. For repair, steps have been taken to isolate metal fuses into remote laser fuse bays. With the ability to store fuse data in a remote location, further steps were taken in both hardware design and test software to serially organize and compress the repair data for fuse storage. At system power-on reset and prior to post-fuse memory test, the fuse data is then decompressed into the original repair data form with the aid of an on-chip decompression system. This has helped reduce the penalty for using metal fuses, but has not eliminated the problem. In addition, the fuse system needs to accommodate varying device designs and types and numbers of memories as well as many diverse ATE Tool types.

The development of an electrically programmed fuse, or e-fuse, has opened the door to many possibilities. The e-fuse is manufactured as a polysilicon link and is significantly smaller than the metal fuse. It can also shrink in size with device technology, as the process continues to develop, because the e-fuse has fewer mechanical dependencies. Because the e-fuse is electrically programmed, it is now possible is to repair the chip multiple times; a first repair at 1 st pass wafer final test (WFT), a second repair at 2nd pass WFT, and a third repair during the final test of the packaged chip. A multiple repair capability provides leverage for testing and repairing memories across various temperatures.

SUMMARY OF THE INVENTION

The invention uses the e-fuse to enable on-chip self repair as part of a manufacturing test. The inventive on-chip self-repair includes new design requirements for all BIST engines responsible for finding memory defects and collecting repair data. It also provides a methodology for a tester 218 to communicate with a system controller 208 regardless of the uniqueness of each ASIC design. This methodology controls system initialization, collection of repair data, and a method of storing this data in fuses.

The invention provides an application specific integrated circuit (ASIC) chip which has memory elements, a plurality of fuses connected to the memory elements that can be programmed to replace defective memory elements with replacement memory elements, and a fuse controller connected to the fuses that can program the fuses. The fuse controller has a standardized test interface protocol for an external tester. The tester is presented with the same interface protocol irrespective of a design of the ASIC chip.

The fuse controller includes an instruction processor adapted to decode instructions from the tester. The fuse controller includes a repair data processing unit adapted to program said fuses. The invention has built-in-self-test (BIST) units connected to the memory elements and fuse controller. The BIST units are adapted to test the memory elements.

The fuse controller includes a repair data processing unit adapted to initiate the BIST units. The invention has repair registers connected to the BIST units, which are adapted to collect repair data relating to the defective memory elements. The repair data processing unit determines lengths of the repair registers. The repair data processing reads and decompresses fuse data prior to initiating the BIST units. The repair data processing collects and compresses repair data after the BIST units test the memory elements. The repair data processing interrogates the actual compressed data to count the number of logical "ones" present (e.g., a count of the repairs needed), which represents the number of fuses needing to be programmed. A fuse program count value is relayed to the tester, so that fuse programming time may be minimized. The fuses comprise e-fuses. Each of the fuses includes a fuse skip multiplexor adapted to cause fuses that are not to be programmed to be passed over during fuse programming.

The invention also provides a method for programming fuses to replace defective memory elements with replacement memory elements on an application specific integrated circuit (ASIC) chip. The invention issues instructions from an external tester to a fuse controller on the ASIC chip. The fuse controller has a standardized test interface protocol. The tester is presented with the same interface protocol irrespective of a design of the ASIC chip. The invention decodes the instructions using the fuse controller. The invention then tests memory elements on the ASIC to identify the defective memory elements using the BIST units under control of the fuse controller. The invention also programs the fuses using the fuse controller.

The decoding is performed using an instruction processor within the fuse controller. The programming of the fuses is performed using a repair data processing unit within the fuse controller. The testing comprises initiating built-in-self-test (BIST) units using the repair data processing unit. The invention reads and decompresses fuse data prior to initiating the BIST units using the repair data processing unit. The invention collects repair data relating to the defective memory elements in repair registers and determines lengths of the repair registers using the repair data processing unit. The invention determines a time needed to program the fuses based on the number of logical "ones" present in the actual compressed fuse data. After the testing of the memory elements, the invention collects and compresses repair data using the repair data processing unit. The invention passes over fuses that are not to be programmed during the programming of the fuses using a fuse skip multiplexor.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

Figure 1:
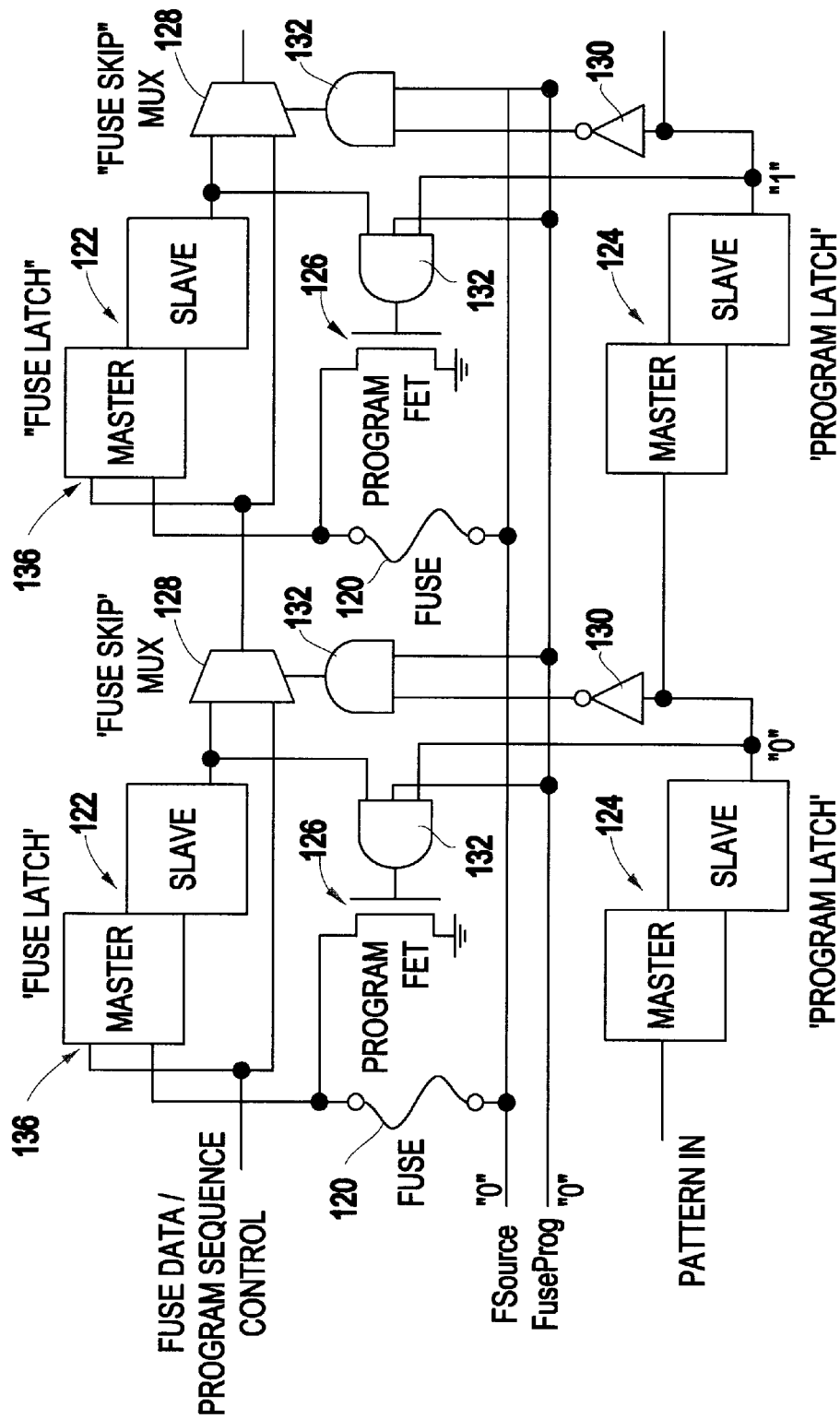
FIG. 1 is a schematic diagram of an e-fuse programmable shift register.

One element enabling on-chip self repair is the electrically-programmed fuse (e-fuse). The e-fuse can best be viewed as an electronically programmed read-only bit. The e-fuse shown in FIG. 1 includes several components: the polysilicon fuse 120, a fuse latch 122, a program latch 124, a program field effect transistor (FET) 126, a look-ahead programming multiplexor (mux) 128, an inverter 130, and AND circuits 132.

The fuse 120 has two possible logic states. It can remain intact where its value is evaluated as a logical 'zero'. The other state is "programmed" (e.g., blown, opened, etc.) and evaluates to a logical 'one' in this example. For example, a direct current (DC) pulse of 10 mA in amplitude and duration of 200 us can program the fuse 120. This relatively high current programs the fuse by dramatically increasing the resistance of the polysilicon link 120. This method of programming poses additional challenges with respect to delivering the current necessary to program each fuse. However, the necessity of limiting the fuse programming current to a single fuse at a time is balanced by the need to program only a subset of the total number of fuses on any given chip. This presents an opportunity for a significant savings in fuse-programming time, as explained in greater detail below.

A fuse latch 122 (comprising master and slave units) is associated with each fuse 120. The fuse latch serves a number of functions. For example in one embodiment, during fuse programming, all fuse latches are initialized to a logical 'zero', and then a single logical 'one' is shifted through, providing a sequence enabling mechanism to determine when to program each fuse. Similarly, when reading the fuse values, the fuse latch 122 is used to sense and store the fuse value. The fuse latch 122 has an additional data port 136, used to create a daisy chain between all fuses, which permits serial access to all fuses. Because of the relatively high DC current requirements required to program a single fuse, a logical 'one' is shifted through a field of zeroes using the daisy chained state latches in order to program one fuse at a time.

The remaining components are functional when programming the fuse. The desired state of the fuses, more specifically the compressed fuse data, is shifted into the program latches 124. When a program latch 124 is loaded with a logical 'one', it selects the program FET 126 and also disables the look-ahead programming multiplexor (mux) 128. The look-ahead mux 128 causes the fuse latch's shifted 'one' to skip over fuses which are not selected for programming, thereby saving fuse programming time. For programming to occur, an EFuseProg signal is enabled and a high voltage is placed across the fuse using the Fsource input and the resulting current is sunk through the program FET 126. Only when this high current path is enabled can the fuse be programmed. The program FET is enabled when the program latch is set and the shifted 'one' arrives at the fuse latch 122. The e-fuse enables the opportunity for the development of on-chip repair, where at the conclusion of test the compressed repair data is programmed into e-fuses. This enables multiple repairs after varying test conditions or even after test of the packaged chip.

Figure 2:
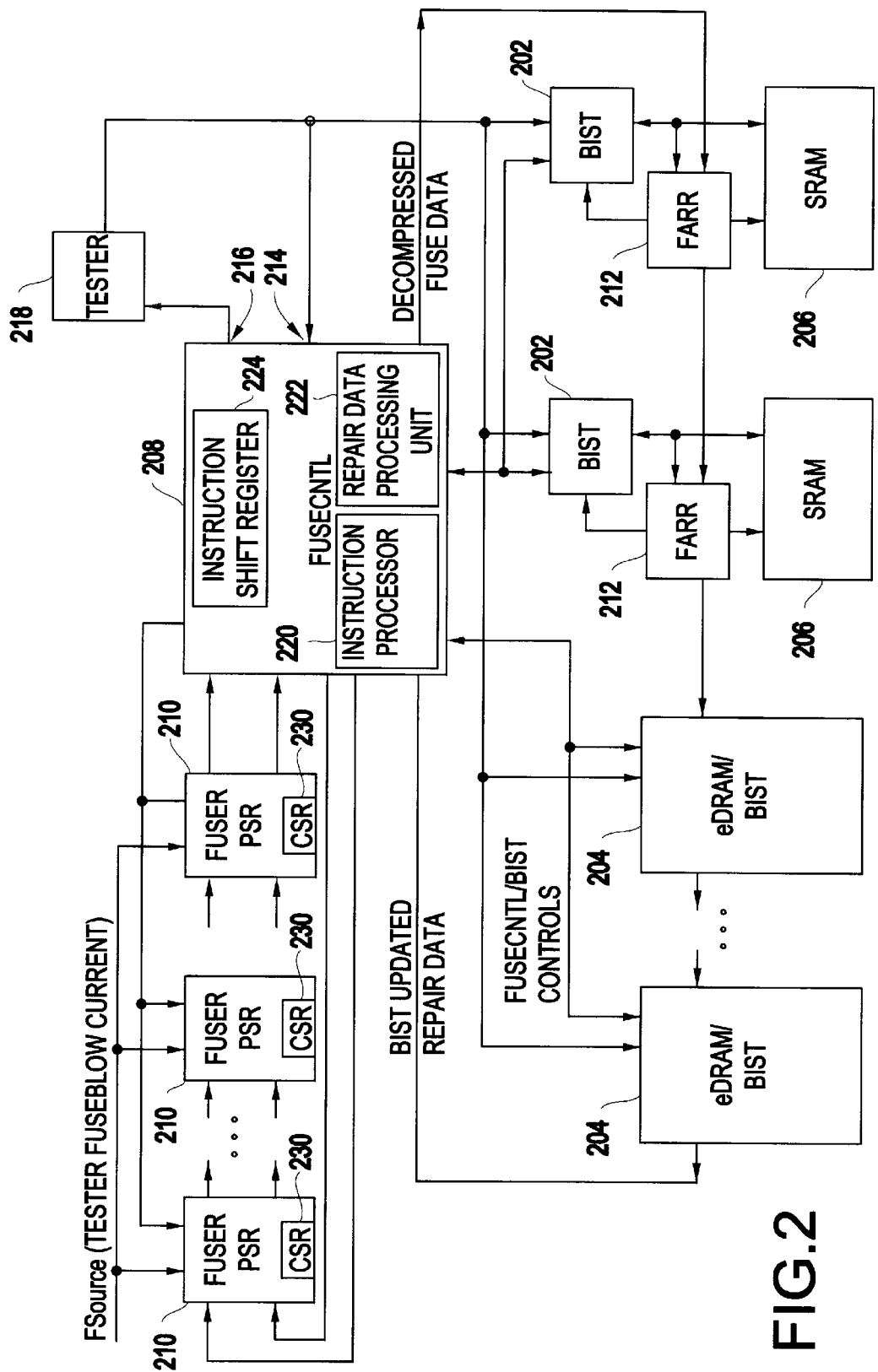
FIG. 2 is a schematic diagram of a chip that includes the inventive fuse control unit.

To enable multiple on-chip repairs, built-in self-test (BIST) engines (FIG. 2) are made capable of collecting a complete repair solution. The BIST engines 202, 204 are also capable of adding additional new repairs to the previous repair solution. When not collecting repair data, the BIST engines 202, 204 are disabled such that they do not modify the most recent repair data. Most importantly, the design is able to perform many sequential operations without use of the level sensitive scan design (LSSD) scan chains, so that the state of all elements may be preserved for the next operation. For reduced pin-count logic testers to be used, the design also avoids driving the "new test only" I/O. This is avoided through the use of the instruction shift register 224 within the fuse controller, which allows many different operations to be performed. The control and input signals to the instruction shift register may be shared with the chip's existing test only scan-in pins, since the two functions of these pins (LSSD scan and instruction loading) are mutually exclusive. With the invention, designs are able to operate on any automated test equipment (ATE) via automatic test pattern generation (ATPG) direct release mechanisms. This is accomplished by creating ATE independent test patterns to control each individual fuse controller operation.

In order to perform on chip-repair, a complete redundancy solution is generated. Thus, all BIST engines 202, 204 are run prior to fuse programming. Before a BIST engine is run, it is provided access to previously stored results or is initialized so that it has a valid starting point. To add more complexity to the system, not all BIST engines 202, 204 can operate concurrently. For example, static random access memory (SRAM) 206 BIST engines 202 may be run concurrently and dynamic random access memory (DRAM) BIST engines 204 may be run concurrently however, SRAM and DRAM BIST engines 202, 204 may not be run concurrently because the SRAM and DRAM BIST engines 202, 204 have different operating requirements and different tester 218 stimuli. This allows the tester operator the flexibility of determining how many times to run BIST, and in which order, etc. This allows a savings in test time when only SRAMs or DRAMs are present on the chip. The savings in test time may also be realized by running SRAM BIST prior to eDRAM BIST or vice-versa. This also allows the collection and composting of failing address repair data across multiple BIST passes at various power supply voltages.

There are new components provided by the invention that enable on-chip repair. A fuse controller 208 (FUSECNTL) is used to arbitrate control between the various BIST engines 202, 204 and perform the "on system" tasks used to unload, load and program e-fuses. Another component used for self repair are e-fuse programmable shift registers (PSRs) 210, each of which includes a number of e-fuses, two of which are shown and explained above with respect to FIG. 1. In one example, each fuse PSR contains 384 fuses and associated circuitry. Multiple PSR macros 210 are used. The number of fuse PSR macros required is dependent upon the amount of each type of memory product on the chip. Chips with more memory will require more fuses.

The fuse controller 208 design is used to route BIST collected repair data from the failing address and repair registers (FARR) 212 in the memories to the fuse PSRs 210 prior to fuse programming. The controller is additionally used to route repair data from the fuse PSRs 210 into the repair register of the memories prior to running BIST or prior to system memory operation.

Figure 3:
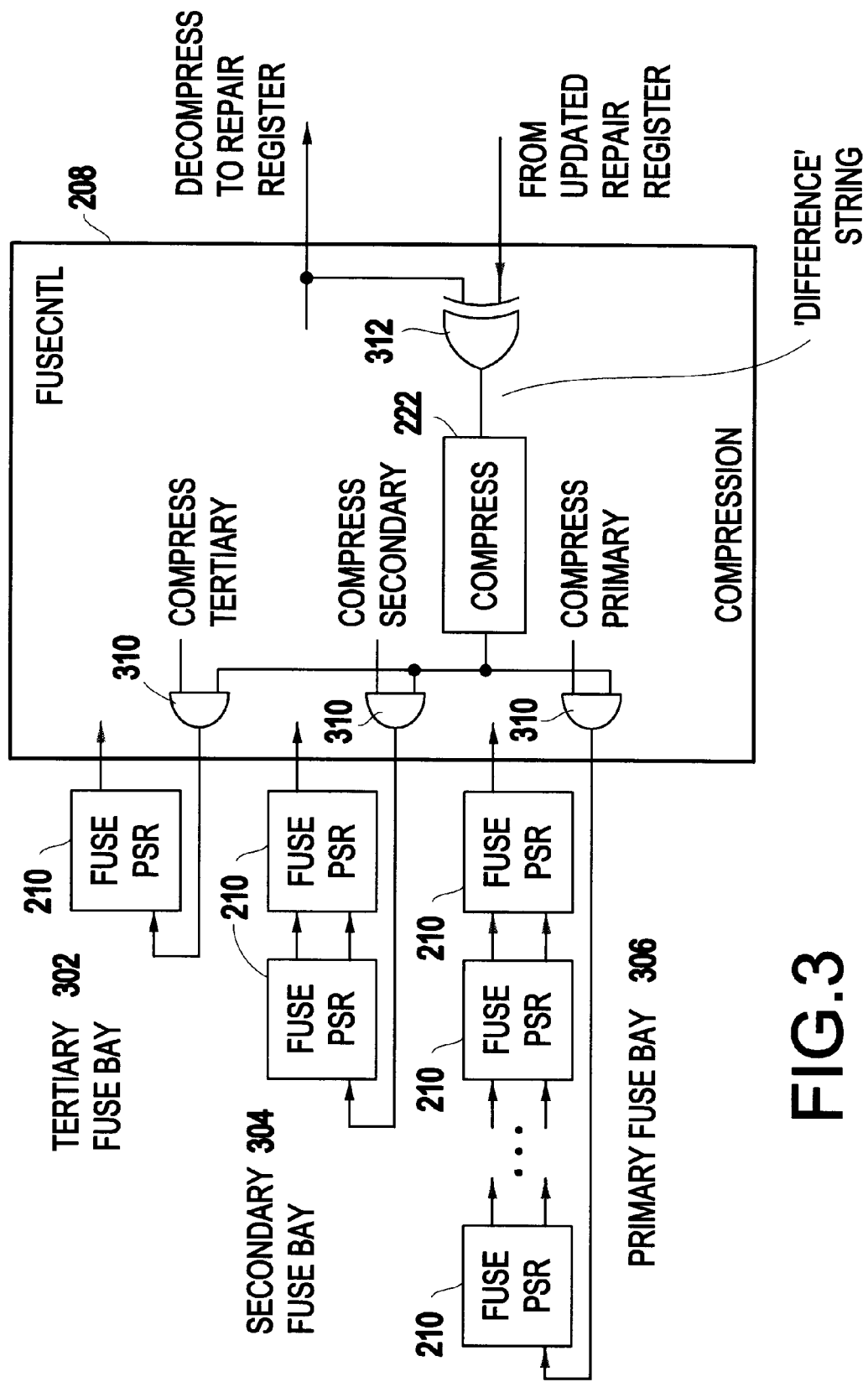
FIG. 3 is a schematic diagram illustrating the compression performed by the fuse controller and the base of programmable shift registers.

As shown in FIG. 3, fuse bays 302, 304, 306 are used for storing the memories' repair solutions. Each fuse bay 302, 304, 306 includes a number of PSRs 210 daisy chained together. The PSRs 210 contain a read control shift register (LSR) 230 (FIG. 2) which is used to control the reading of groups of fuses in a sequential manner. As a logical "one" is shifted through this read shift register, each latch in the read shift register allows a certain number of fuses to be read.

Figure 4:
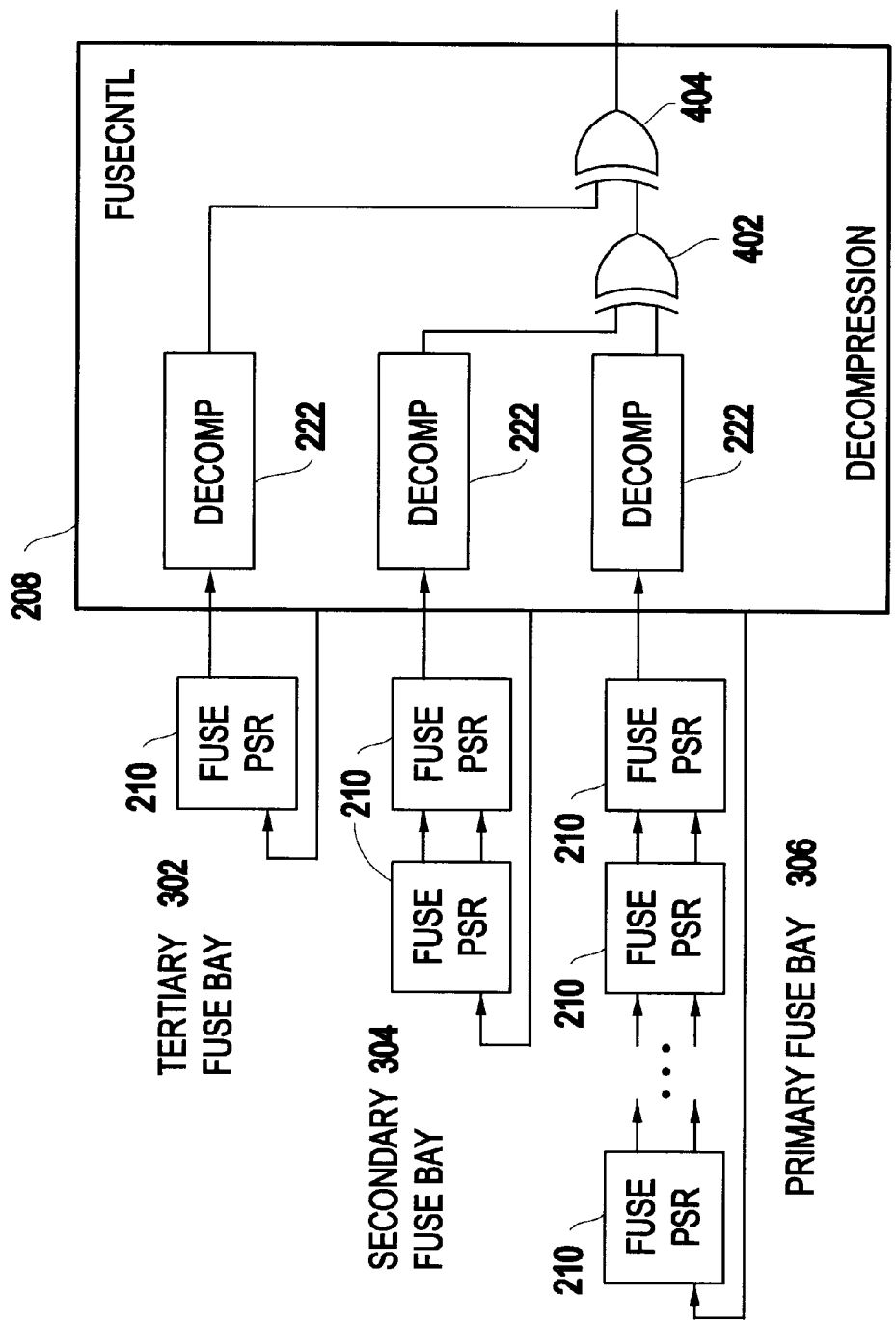
FIG. 4 is a schematic diagram illustrating the decompression performed by the fuse controller and the programmable shift registers.

Reading an unprogrammed fuse requires current to be sourced through the fuse, and when reading multiple fuses the required current sourced from the power supply rails may be substantial. Because of the power required to read fuses, only a sub-set of the fuses within one fuse PSR are read at one time. A sub-set of fuses is read when the sub-set's read signal is asserted via the read control shift register. On the next clock cycle the read signal is transferred to the next read control shift register latch, so that the next sub-set of fuses may be read As shown in FIGS. 3 and 4, the overall e-fuse system design approach actually contains multiple separate fuse bays; such as the primary 306, secondary 304 and tertiary fuse bays 302 shown in FIG. 3. The primary fusebay 306 is used to program the first pass test's repair data, while the secondary 304 and tertiary 302 fuse bays are used to implement the second and third pass tests' repair data, respectively. Since most defects are found in the first pass of test, the primary fuse bay 306 will be significantly larger than the secondary 304 and tertiary 302 fuse bays. The third pass of test will find the fewest defects, so that the tertiary fuse bay 302 will be the smallest.

Each fuse bay is considered to contain valid repair data, if and only if, the first bit shifted out after a read, known as the 'fused' bit, is programmed to a logical 'one'. For the primary fuse bay, the next set of bits contain a count of the total number of latches in the failing address and repair register 212. This number is acquired and stored by the controller 208 and is only programmed in the primary fusebay. The length of the repair register is needed by the controller 208 so that repair data may be properly shifted into and out of the repair register. The remaining fuses in the primary fuse bay contain the first pass test compressed repair data. For the secondary and tertiary fuse bays, the bits following the 'fused' bit contain compressed modifications to the primary fusebay's repair data.

The controller 208 has a generic interface protocol for the tester 218, independent of the customer's ASIC design. Under normal system operation and during test, the controller 208 is responsible for reading, shifting and decompressing the programmed repair data from the fuse bays 302, 304, 306 into the memories' repair register. During test, the controller 208 is additionally used to enable and control the appropriate BIST engines 202, 204 at the correct time, shift and compress the BIST updated repair data from the memories' repair register to the appropriate fuse bays, control fuse programming, and verify that they are correctly programmed.

Each of these steps is controlled by the external tester 218 which provides the appropriate instruction to the controller 208 through a serial access port 214. For each instruction issued to the controller 208, a status pin 216 is made available by the controller 208 for the tester 218 to observe. This status pin 216 is asserted at the successful completion of each instruction. If no assertion occurs after some predefined number of clock cycles, this indicates that an error occurred in that step or that it is not possible to generate a repair solution for this chip. Based on the state of the status pin 216, the tester 218 can respond appropriately by either continuing testing or aborting and moving to the next chip and continuing testing.

The controller 208 includes an instruction processor 220 and a repair data processing unit 222. The instruction processor 220 controls the various steps by decoding instructions issued from the tester 218. The repair data processing unit 222 contains the decompression and compression logic. FIG. 3 shows the compression logic and FIG. 4 shows the decompression logic.

As shown in FIG. 3, repair data from the memories' BIST-updated repair register 212 is shifted through an exclusive-or gate 312 to the repair data processing unit 222 where it is compared with the decompressed fuse data of the currently programmed fuse data. The resulting 'difference' serial string is compressed and shifted into the selected fuse bay through AND gates 310 for the appropriate level of repair. As shown in item 502 in FIG. 5 discussed below, at the first pass wafer final test (WFT), where the fuses have not yet been programmed, the currently programmed repair solution is all zeroes (scan initilization ("scaninit")), so that the BIST-updated repair register data is unchanged by the exclusive-or gate 312. The unchanged repair register data is then compressed and shifted to the primary fuse bay 306. The serial compression algorithm is discussed in greater detail with respect to FIG. 6 below.

FIG. 4 shows the decompression logic of the repair data processing unit 222. Fuse data from all three fuse bays 302, 304, 306 is decompressed and combined into a single serial string, then shifted to the memories' repair register.

Figure 5:
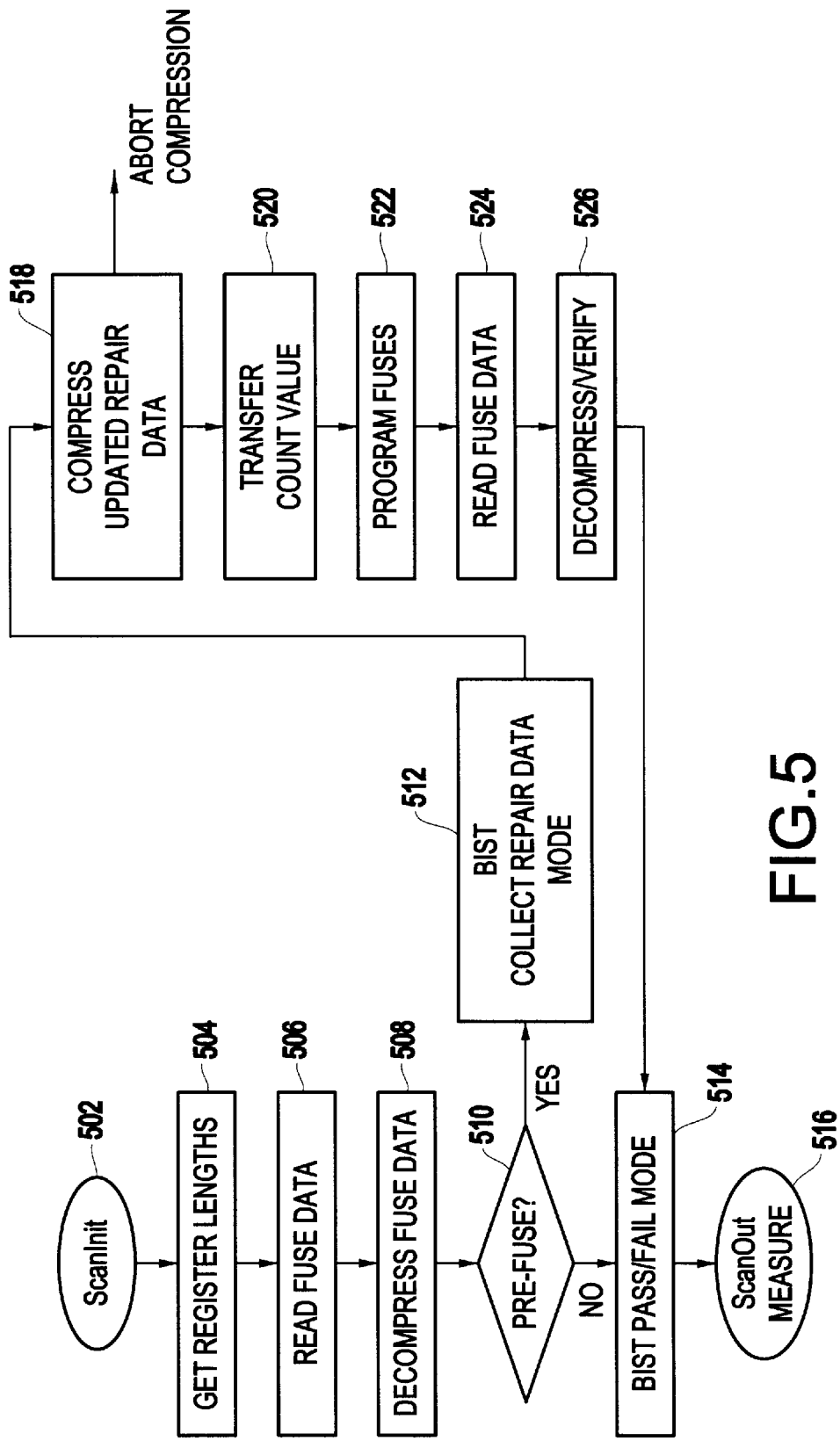
FIG. 5 is a flowchart illustrating the processing performed by the invention.

A flowchart describing the macro-test flow for testing and repairing memories using e-fuses is show in FIG. 5. Each "box" in the flowchart represents a fuse controller 208 instruction. Thus, the instruction processor 220 allows the tester 218 to control the current step. These instructions (some of which are shown in FIG. 5) can include, for example: "get repair register length (design dependent)" 504; "read fuse data" 506; "decompress fuse data" 508;

"BIST" 512; "compress updated repair data" 518; "transfer count value" 520; "program fuses" 522; and "decompress/verify programmed fuses" 526.

At test, each step is explicitly enabled by the tester 218. In order for correct operation of compression and decompression, the decompression and compression logic in the repair data processing unit 222 needs to have access to the exact number of repair register 212 latches used by the memories to store the repair data. The repair register length is different per chip design, depending how many of which types of memories are used. The "get repair register length" instruction 504 will count the design's repair register latches in the FARRs 212 and the DRAMs 204 to provide this function. This instruction only needs to be executed during the first pass of test. The repair register length value is stored in the primary fuse bay 306 as part of the first repair solution and is available for future use. Prior to executing this command, all repair register latches are initialized to logical 'zeroes' during scan initialization 502. The count is generated by shifting a logical 'one' from the fuse controller through the entire chain of latches in the FARRs 212 and the DRAMs 204 and incrementing a count for each clock cycle until the shifted 'one' returns to and is observed at the controller 208. At this point, the status pin 216 is asserted instructing the tester 218 that the instruction is complete.

The "read fuses" instruction 506 will cause the e-fuses to be read from all fuse bays 302, 304, 306. Because of the power demand associated with reading fuses, fuses are read by shifting a logical 'one' through the read control shift register 230 latches in each fuse PSR 210, allowing only a sub-set of the fuses in the fuse bay to be sensed concurrently. When the read signal returns to the controller 208, all fuses have been read. The controller 208 next proceeds to remove the fused bit from each fuse bay. If this bit is programmed, then the fuse bay contains fused data; otherwise it is available for programming. If the primary fuse bay is programmed as indicated by the fused bit, the repair register latch count is extracted. At this point, the next data available from the fuse bays is the compressed repair data, and so the shifting of fuse data from the fuse bays stops. When these operations have completed, the status pin 216 is asserted.

The "decompress fuse data" instruction 508 directs the controller 208 to decompress the compressed repair data. If no data is available, the status pin 216 is immediately asserted, instructing the tester 218 to move on. In this case, the scan initialization serves as a valid starting point for the BIST engines 202, 204. However, if there is data in the fuse bay, it is decompressed. This instruction 508 contains one bit per fuse bay that can disable the decompression of data from that particular fuse bay. This capability allows a programmed fuse bay's data to be ignored during decompression and is available for system diagnostics. When decompression has successfully completed, the status pin 216 is asserted and the tester 218 can respond appropriately.

Decision blocks 510 determine whether the structure is in a pre-programmed state "pre-fuse" state. If the structure is in the pre-programed state, processing proceeds to item 512 were the BIST operation is performed. Otherwise, processing proceeds to item 514 where a BIST pass/fail mode testing operation is performed to determine whether the program device passes all necessary tests. More specifically, after fuse programming, the memory repair actions may be verified. For this verification test sequence, the memory BIST test sequences 514 are applied across the multiple test corners. At their conclusion, a test sequence uses a scan to measure the pass/fail bits for each of the memories 516. In the event that these results indicate that a memory has not been repaired, a decision can be made to either dispose of that chip or to re-test and apply any new repairs that may be found.

The "BIST" instruction 512 releases control to the designated BIST as specified in the instruction. This instruction can enable either the DRAM 204 or SRAM BIST 202. Each time this instruction is loaded, the specified BIST engine receives a restart signal to unlock it. When not in use, the BIST engine must disable itself so that it cannot corrupt its solution while being clocked. The BIST instruction also includes data bits that are used for specifying different modes of BIST operation. These bits give the tester 218 the flexibility to vary the ways in which BIST is run; whether to collect failing addresses or set a pass/fail bit, vary the number of times BIST is run, and vary the order, without using the logic test scan chains. This allows a savings in test time when only SRAMs or DRAMs, but not both, are present on the chip design. When optimizing the test flow, a savings in test time may also be realized by running SRAM BIST 202 prior to running DRAM BIST 204 or vice-versa. At completion of running DRAM 204 or SRAM BIST 202, the fuse controller's status pin 216 allows the tester 218 to observe whether the corresponding memories are repairable. Based on this information, the tester 218 can respond by either aborting and moving on to the next chip, or scanning data off line for analysis.

The "compress updated repair data" instruction 518 performs several functions. After BIST is completed, the data in the repair register 212 may have been updated. This updated repair data will be shifted into the fuse controller 208, while at the same time the fuse data from all three fuse bays 302, 304, 306 (data which was previously read with the read fuse data instruction) is shifted through the decompression logic in the repair data processing unit 222. The output serial strings of the decompression logic and the incoming repair register data from the memories are compared with exclusive-or gate 312 to form a 'difference' string as shown in FIG. 3. This difference string is then compressed and the compressed result is shifted into the selected fuse bay. For example, if a repair has already been programmed into the primary fuse bay, and a second level of repair is being performed, then the secondary fuse bay is selected at this time.

In addition, the compression can be aborted, as shown in FIG. 5. More specifically, a set of latches is present in the fuse controller 208 instruction register to select only one fuse bay during compression and to direct the shifted 'one' to the selected fuse bay's fuse latches during fuse programming. There is one instruction latch available per fuse bay and only one of these latches can be enabled per instruction. These latches are also logically combined with the first fuse of the fuse bay to determine whether or not to enable fuse programming in the selected fuse bay. If the 'fused' bit is programmed in the selected fuse bay then the attempted fuse programming operation is not allowed. For example, if, during the initial fusedecompression operation, the single fuse bit shifted out of the primary is already blown the fuseblow operation is aborted. This could very easily happen if a test operator makes the mistake of running the same macro-test pattern which is used to allow fuseblow in a previously used fusebay. It is quite simple, for one skilled in the art, to see that this abort fuseblow protection mechanism could be extended "n" times for a system incorporating "n" fusebays for "n" levels of repair. This protects the selected fuse bay from being programmed twice, as this could destroy the chip.

As the compressed data is being shifted, the fuse controller 208 counts the number of logical 'ones' that are shifted into the program register of the selected fuse bays. Each logical 'one' represents a fuse that needs to be programmed, thus producing a count of the number of repairs needed. During compression, the repair data being shifted into the controller 208 from the memories' repair register is also being shifted back into the memories' repair register, so that it may be later accessed to support diagnostics capabilities. At the completion of compression, the fuse controller 208's status pin 216 is asserted and the logical 'ones' count value may be used by the tester 218 to take full advantage of the e-fuse design in order to shorten the time required to program fuses. The "transfer count value" instruction 520 causes the controller 208 to shift the logical 'ones' count value, acquired during the compression instruction 518, to the tester 218 via the fuse controller's status pin 216.

The "program fuses" instruction 522 enables the programming of fuses as discussed earlier. A logical 'one' is shifted through the fuse latch 122 register of the e-fuse PSRs 210 to step through the programming of the e-fuses. When this logical 'one' returns to the controller 208, the status pin 216 is once again asserted. Prior to the execution of this instruction, the tester 218 must provide the necessary voltage on the Fsource pin (shown in FIG. 1) for programming e-fuses. Likewise, at the completion of this instruction, the voltage on Fsource should be disabled.

The "decompress/verify" instruction 526 is used to decompress the newly programmed fuse data for setting up the final BIST test and at the same time verify that all fuses have been programmed correctly. Prior to running this instruction, all fuses are again read 524, using the previously described "read fuses" instruction 506. During the execution of the "decompress/verify" instruction, the fuse latch data and the program latch data are both shifted into the fuse controller 208, where they are compared. At the same time, the fuse data from all three fuse bays is decompressed. The previously BIST-updated repair register data is still available in the memories' repair register and is also shifted into the fuse controller 208 where it is compared to the decompressed string. If any program latch/fuse latch or decompression/repair register miscompares occur, then either the fuses did not program correctly or the compression logic is not working properly. If no miscompares occur then the status pin 216 is asserted at the completion of this instruction. Then processing again returns to items 514 and 516, discussed above.

A master fuse program enable latch is also contained within the controller 208 instruction register. This latch is reset during system power-on-reset, so that the fuse programming operation is prevented during normal system operation. If the master fuse program enable latch is not set during manufacturing test, only fuse data decompression will run, and upon successful completion, the controller 208 will release control to both the SRAM and DRAM BIST engines 202, 204.

Figure 6:
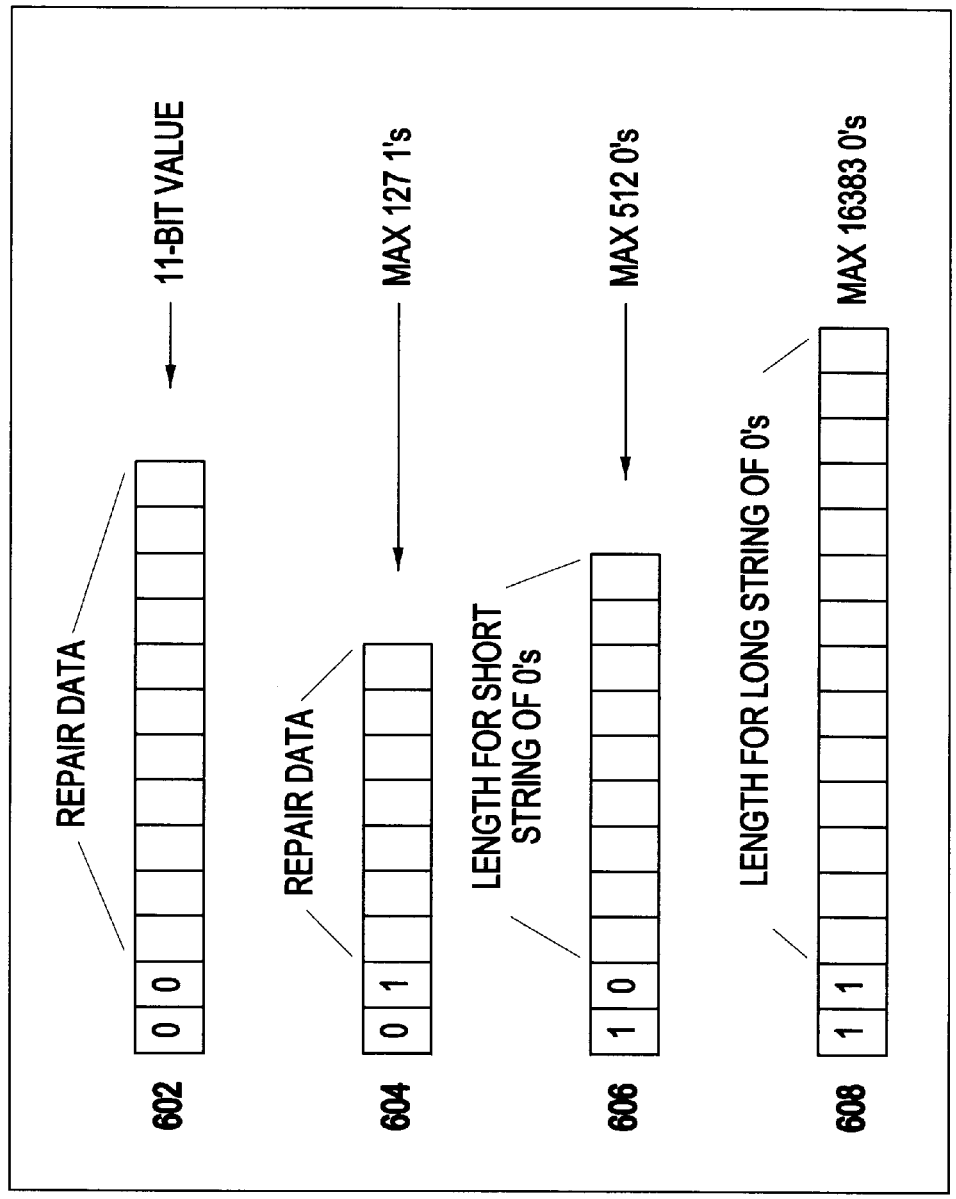
FIG. 6 is a schematic diagram illustrating different sizes of memories.

In order to better minimize the number of physical fuses, an improved compression algorithm which uses a two bit opcode is provided by the invention. The two bit opcode selects either an uncompressed mode or a runlength encoding of zeroes or ones, as shown in FIG. 6. More specifically, item 602 in FIG. 6 represents a fixed bit (e.g., 11 bit) latch were the first two bits are both zero to hold a few zeros and a few ones (for row redundancy). To the contrary, if the first bit is zero and the second bit is one, the length for the string of ones is known (and has a maximum value (e.g. 127)) for column redundancy as shown in item 604. To the contrary, if the first bit is one and the second bit is zero, the invention provides a predetermined length for a short string of zeros (which has a maximum value (e.g., 512)), as shown in item 606 (for unused redundancy). Finally, when the first two bits are both one, the invention provides a predetermined length for a long string of zeros (which has a maximum value (e.g., 16383)) as shown in item 608 (for unused rendundancy). This variable-length instruction compression format is optimum for transforming a repair register's serial data into a compressed serial string.

The test patterns used to operate the fuse controller 208 for the embedded memory test and repair process begin as generic macro-pattern rules (MPRs). The MPRs are qualified and released into the ASIC technology library. As the complete set of test patterns is created for each specific ASIC product, these generic MPRs are used by ATPG to automatically tailor and construct the test patterns for the on-chip e-fuse process. The test patterns mirror the flow of the on-chip fuse controller 208 and BIST application described in the previous sections. The test patterns and tester 218 interface are simplified by the fact that the majority of the test and repair processes are controlled and applied by on-chip design for test (DFT). The test patterns contain separate test sequences for each of the steps in the e-fuse process. The MPRs and ATPG insert identifying labels into each of these test sequences. These labels are used during the construction of the ATE test program.

The initialization test sequence applies a scan, which initializes the controller 208, BIST engines 202, 204, and memory repair registers appropriately. The remaining operations are each performed without using the scan chain access. The test sequence then issues the necessary instructions and clocks to prepare the BIST engines 202, 204 for test by decompressing any compressed fused data. After each instruction, the status pin 216 is measured by the test sequence to verify correct operation of the instruction. A failure of this measure is used by the tester 218 program to abort the pattern application and move on to the next chip or begin diagnostics.

The initialization patterns are followed by a series of test sequences to control the BIST testing. Each test sequence causes the controller 208 and BIST engines 202, 204 to apply an SRAM or DRAM test pattern. While the BIST engines 202, 204 run, on-chip registers associated with each repairable memory accumulate any fuse repair that is identified by the BIST patterns. While power is maintained to the product, the repair data is saved internally in the repair register. The accumulation registers and repair registers may be one and the same, depending upon how the BIST is designed. The tester 218 control program may change test conditions between some of the test sequences. The memory tests can be applied at low, nominal, and high conductance corners. In addition, some of the test sequences contain labeled break points where the on-chip BIST and external tester 218 control program will both pause for retention tests or, alternately, for the elevation of the voltage level to stress the product. Throughout these memory tests, the tester 218 does not measure or accumulate any repair data. Thereby, the content of these test sequences is quite simple.

Each memory BIST test sequence starts by loading a new instruction into the fuse controller 208. The instruction indicates the specific BIST pattern to apply. The BIST engines 202, 204 are then enabled and clocked. Since memory elements are typically tested in parallel, the duration clocking is long enough to test the largest memory to completion. As the smaller memories complete, they enter an idle or locked state. At the end of each BIST application, the controller 208 sets the status pin 216 appropriately. Each BIST test sequence ends by measuring this pin. A fail indicates that either the memory tested is not repairable or that the BIST did not complete for some reason. This gives the test program a chance to begin diagnostics or abort and move to the next chip.

The fuse program test sequence follows the application of the memory tests. This test sequence causes the controller 208 to shift the repair register data, run fuse compression, and load the compressed repair data into the selected fuse bay. The count of fuses to be programmed, which is created by the controller 208, is read by the tester 218. This is used to minimize the time spent programming the fuses by modifying the repeat count for the 200 us fuse program cycle. The tester will use the provided binary count value to update the tester loop count for the next sequence, providing just enough cycles to cause the correct number of fuses to be blown. The invention provides the benefit of forecasting the time that will be needed to blow all needed fuses once the time needed to blow an individual fuse is known (e.g., 200 us per fuse).

The modified pattern then raises the voltage on the Fsource pin sourcing current to program the fuse and applies the appropriate clocks for each fuse to be programmed. This is followed by a fuse read operation, and then a fuse data decompression operation with the compare function enabled. The fuse controller's status pin 216 is then observed to verify that the fuses were programmed correctly. However, it is most probable that the optimum approach would be to reserve the second repair action for a second pass of WFT at a different temperature, so that temperature sensitive defects could be repaired. The third test and repair sequence would most likely be reserved for testing and repairing the final packaged chip.

Figure 7:
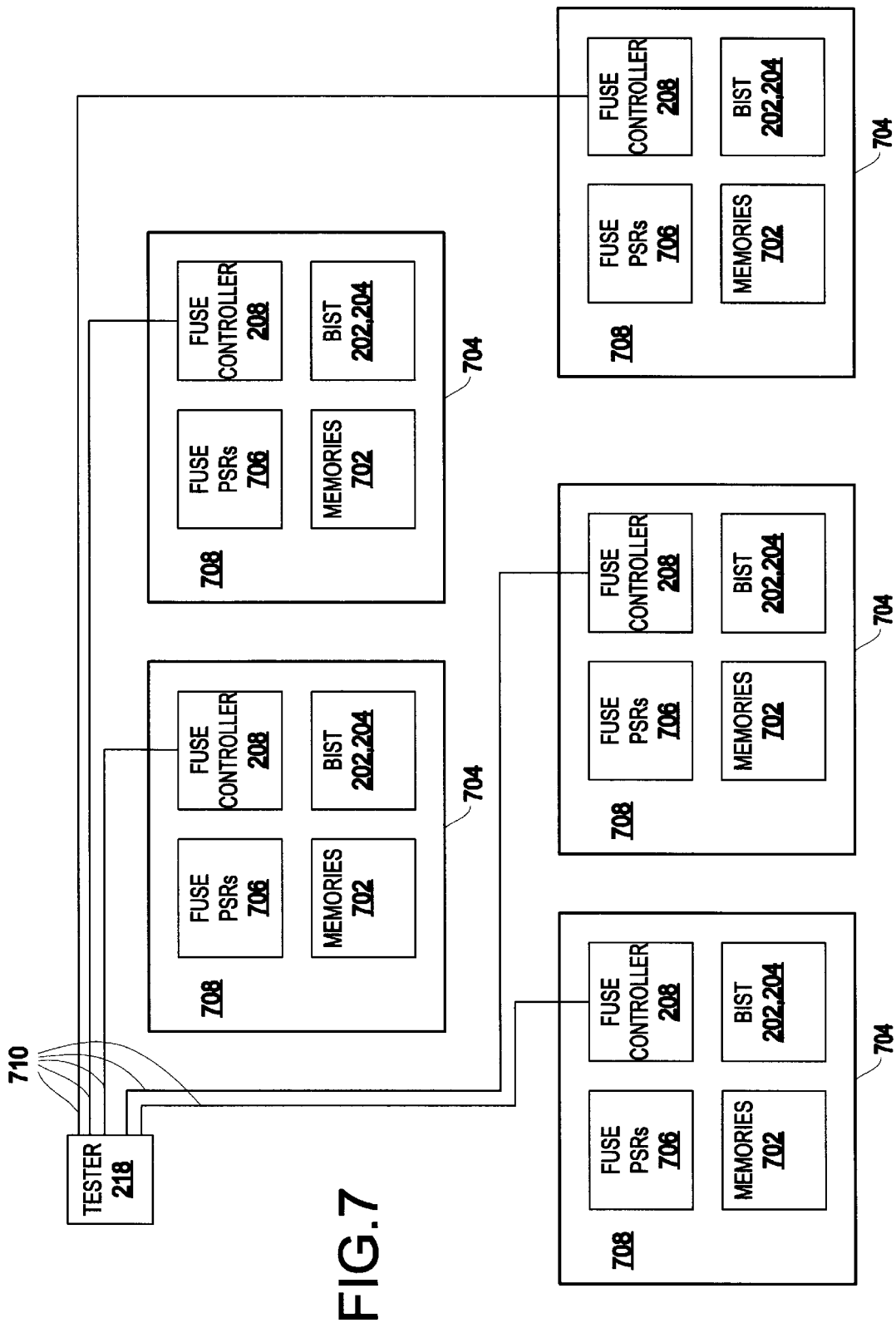
FIG. 7 is a schematic diagram illustrating multiple fuse macro domains.

In addition, as shown in FIG. 7, multiple fuse controllers 208 may be used on an ASIC that contains a large amount of memories 702. In this case, the memories on the ASIC are divided into fuse controller domains 704. Each domain 704 is controlled by an individual fuse controller 208, with a separate set of fuse PSRs 706 for each domain. Each set of fuse PSRs 706 is connected to a separate FSOURCE pin 708. Each fuse controller is observed by the tester through a distinct output pin 710. In this way, the multiple domains may be run completely in parallel, allowing each tester sequence to occur in parallel across all domains.

There are several advantages that are derived from this parallel operation capability. By limiting the number of memories 702 in a domain 704, the length of the repair shift register is prevented from growing exorbitantly large, and as a result, the length of time required for decompression and compression will be prevented from growing exorbitantly large. This helps to maintain a reasonable power-on-reset (POR) pulse width specification for the system application of running decompression as part of the system power-up sequence, while allowing significant amounts of memory on a die. It also prevents the test time from growing exorbitantly, due to the ability to blow a single fuse from each domain concurrently. For this to occur, the tester would have to use the maximum fuseblow cycle count value from the multiple domains, and run that many fuseblow cycles in parallel across all domains.

The fuse controller 208 provides a consistent and standardized interface protocol to the external tester and acts as a limited interface between the tester and the BIST 202, 204. Therefore, the fuse controller 208 uses information specific to the ASIC in which it is created (e.g., register lengths, types of BISTs, etc.) so that the tester can treat all ASIC chips that include a fuse controller 208 similarly. This reduces the need for the tester to deal with the individual differences of each ASIC chip. More specifically, the fuse controller 208 performs the functions specific to each associated ASIC allowing the tester to simply issue identical instructions to all fuse controllers on many different chip designs and allowing each individual fuse controller to test its specific ASIC structure Thus, the invention provides an on-chip e-fuse system where memory test, repair data calculation, e-fuse programming and post fuse test all can occur in a single test contact without data ever leaving the chip. Additional fusing capability can allow for enhanced yield of packaged chips. This permits an efficient usage of e-fuses in a complex ASIC test environment.

While the invention has been described in terms of preferred embodiments, those skilled in the art will recognize that the invention can be practiced with modification within the spirit and scope of the appended claims.

What is claimed is:

1. An application specific integrated circuit (ASIC) chip comprising:
   memory elements;
   a plurality of fuses connected to said memory elements and being adapted to be programmed to replace defective memory elements with replacement memory elements; and
   a fuse controller connected to said fuses and being adapted to program said fuses,
   wherein said fuse controller has a standardized test interface protocol for an external tester, such that said tester is presented with the same interface protocol irrespective of a design of said ASIC chip.

2. The ASIC chip in claim 1, wherein said fuse controller includes an instruction processor adapted to decode instructions from said tester.

3. The ASIC chip in claim 1, wherein said fuse controller includes a repair data processing unit adapted to program said fuses.

4. The ASIC chip in claim 1, further comprising built-in-self-test (BIST) units connected to said memory elements and said fuse controller, said BIST units being adapted to test said memory elements.

5. The ASIC chip in claim 4, wherein said fuse controller includes a repair data processing unit adapted to initiate said BIST units.

6. The ASIC chip in claim 5, further comprising repair registers connected to said BIST units and being adapted to store compressed repair data relating to said defective memory elements.

7. The ASIC chip in claim 6, wherein a count of repairs needed in said repair registers determines a time needed to program said fuses.

8. The ASIC chip in claim 5, wherein said repair data processing unit is further adapted to read and decompress fuse data prior to initiating said BIST units.

9. The ASIC chip in claim 5, wherein said repair data processing unit is further adapted to collect and compress repair data after said BIST units test said memory elements.

10. The ASIC chip in claim 1, wherein said fuses comprise e-fuses.

11. A fuse controller for use on an application specific integrated circuit (ASIC) chip, said fuse controller comprising:
   an instruction processor adapted to decode instructions from an external tester; and
   a repair data processing unit connected to said instruction processor and being adapted to program fuses to replace defective memory elements with replacement memory elements on said ASIC; and wherein said fuse controller has a standardized test interface protocol for an external tester, such that said tester is presented with the same interface protocol irrespective of a design of said ASIC chip.

12. The fuse controller in claim 11, wherein said repair data processing unit is adapted to initiate built-in-self-test (BIST) units connected to memories on said ASIC and said fuse controller, said BIST units being adapted to test said memory elements.

13. The fuse controller in claim 12, wherein said repair data processing unit is adapted to initiate said BIST units.

14. The fuse controller in claim 12, wherein said repair data processing unit is further adapted to read and decompress fuse data prior to initiating said BIST units.

15. The fuse controller in claim 12, wherein said repair data processing unit is further adapted to collect and compress repair data after said BIST units test said memory elements.

16. The fuse controller in claim 11, wherein said repair data processing unit is further adapted to store compressed repair data relating to said defective memory elements in repair registers.

17. The fuse controller in claim 16, wherein a count of repairs needed in said repair registers determines a time needed to program said fuses.

18. The fuse controller in claim 11, wherein said fuses comprise e-fuses.

19. A method for programming fuses to replace defective memory elements with replacement memory elements on an application specific integrated circuit (ASIC) chip, said method comprising:
    issuing instructions from an external tester to a fuse controller on said ASIC chip, wherein said fuse controller has a standardized test interface protocol, such that said tester is presented with the same interface protocol irrespective of a design of said ASIC chip;
    decoding said instructions using said fuse controller;
    testing memory elements on said ASIC to identify said defective memory elements using said fuse controller; and
    programming said fuses using said fuse controller.

20. The method in claim 19, wherein said decoding is performed using an instruction processor within said fuse controller.

21. The method in claim 19, wherein said programming of said fuses is performed using a repair data processing unit within said fuse controller.

22. The method in claim 21, wherein said testing comprises initiating built-in-self-test (BIST) units using said repair data processing unit.

23. The method in claim 22, further comprising reading and decompressing fuse data prior to initiating said BIST units using said repair data processing unit.

24. The method in claim 21, further comprising storing compressed repair data relating to said defective memory elements in repair registers.

25. The method in claim 24, further comprising determining a time needed to program said fuses based on said lengths of said repair registers.

26. The method in claim 21, further comprising, after said testing of said memory elements, collecting and compressing repair data using said repair data processing unit.

27. An integrated circuit chip comprising:
    a plurality of fuses adapted to be programmed to replace defective memory elements with replacement memory elements on said chip; and
    a fuse controller connected to said fuses and being adapted to program said fuses,
    wherein said fuse controller has a standardized test interface protocol for an external tester, such that said tester is presented with the same interface protocol irrespective of a design of said chip.

28. The chip in claim 27, wherein said fuse controller includes an instruction processor adapted to decode instructions from said tester.

29. The chip in claim 27, wherein said fuse controller includes a repair data processing unit adapted to program said fuses.

30. The chip in claim 27, further comprising built-in-self-test (BIST) units connected to said fuse controller, said BIST units being adapted to test memory elements.

31. The chip in claim 30, wherein said fuse controller includes a repair data processing unit adapted to initiate said BIST units.

32. The chip in claim 31, further comprising repair registers connected to said BIST units and being adapted to store compressed repair data relating to said defective memory elements.

33. The chip in claim 32, wherein a count of repairs needed in said repair registers determines a time needed to program said fuses.

34. The chip in claim 31, wherein said repair data processing unit is further adapted to read and decompress fuse data prior to initiating said BIST units.

35. The chip in claim 31, wherein said repair data processing unit is further adapted to collect and compress repair data after said BIST units test said memory elements.

36. The chip in claim 27, wherein said fuses comprise e-fuses.

37. An application specific integrated circuit (ASIC) chip comprising:
    memory elements;
    a plurality of fuses connected to said memory elements and being adapted to be programmed to replace defective memory elements with replacement memory elements; and
    a fuse controller connected to said fuses, wherein said fuse controller comprises:
        a standardized test interface protocol for an external tester, such that said tester is presented with the same interface protocol irrespective of a design of said ASIC chip,
        an instruction processor adapted to decode instructions from said tester; and
        a repair data processing unit adapted to program said fuses.

38. The ASIC chip in claim 37, further comprising built-in-self-test (BIST) units connected to said memory elements and said fuse controller, said BIST units being adapted to test said memory elements.

39. The ASIC chip in claim 38, wherein said repair data processing unit is adapted to initiate said BIST units.

40. The ASIC chip in claim 38, further comprising repair registers connected to said BIST units and being adapted to store compressed repair data relating to said defective memory elements.

41. The ASIC chip in claim 40, wherein a count of repairs needed in said repair registers determines a time needed to program said fuses.

42. The ASIC chip in claim 38, wherein said repair data processing unit is further adapted to read and decompress fuse data prior to initiating said BIST units.

43. The ASIC chip in claim 38, wherein said repair data processing unit is further adapted to collect and compress repair data after said BIST units test said memory elements.

44. The ASIC chip in claim 37, wherein said fuses comprise e-fuses.

* * * * *